(12) United States Patent
Augsburger

(10) Patent No.: US 10,015,900 B2
(45) Date of Patent: Jul. 3, 2018

(54) COMPACT FLASH RETAINER

(71) Applicant: Brocade Communications Systems, Inc., San Jose, CA (US)

(72) Inventor: Scott W. Augsburger, San Jose, CA (US)

(73) Assignee: Brocade Communications Systems LLC, San Jose, CA (US)

( * ) Notice: Subject to any disclaimer, the term of this patent is extended or adjusted under 35 U.S.C. 154(b) by 891 days.

(21) Appl. No.: 13/781,506

(22) Filed: Feb. 28, 2013

(65) Prior Publication Data

US 2013/0250524 A1  Sep. 26, 2013

Related U.S. Application Data

(60) Provisional application No. 61/613,447, filed on Mar. 20, 2012.

(51) Int. Cl.
*H05K 13/00* (2006.01)
*H05K 7/14* (2006.01)
*G06K 13/08* (2006.01)

(52) U.S. Cl.
CPC ....... *H05K 7/1427* (2013.01); *G06K 13/0806* (2013.01); *H05K 13/0023* (2013.01); *Y10T 29/49117* (2015.01)

(58) Field of Classification Search
CPC ...................................................... H05K 7/14
USPC .......... 361/679.01–679.45, 679.55–679.61, 361/724–747, 752–759, 796–837
See application file for complete search history.

(56) References Cited

U.S. PATENT DOCUMENTS

| | | | | |
|---|---|---|---|---|
| 4,694,380 A | * | 9/1987 | Mallory | H05K 7/1461 206/485 |
| 5,155,663 A | * | 10/1992 | Harase | G06K 19/07732 273/148 B |
| 5,490,038 A | * | 2/1996 | Scholder | G06F 1/184 174/50 |
| 5,691,504 A | * | 11/1997 | Sands | G06F 1/182 174/372 |
| 5,724,231 A | * | 3/1998 | Winick | G06F 1/184 361/726 |
| RE35,915 E | * | 10/1998 | Hastings | G06F 1/181 439/377 |
| 5,878,013 A | * | 3/1999 | Maeda | G11B 17/03 720/606 |

(Continued)

*Primary Examiner* — Courtney Smith
*Assistant Examiner* — Rashen E Morrison
(74) *Attorney, Agent, or Firm* — Bever, Hoffman & Harms, LLP

(57) ABSTRACT

A method and apparatus for retaining a removable module (such as a memory card) in engagement with an interface structure of a printed circuit board (PCB). The PCB is coupled to a tray, wherein the module is positioned between the PCB and the tray. The tray includes one or more forms configured to receive the module, and prevent the module from moving out of engagement with the interface structure of the PCB. A first form includes a depressed region formed in the tray, wherein the module is fitted within the depressed region. A slot, which extends through the tray, may be located adjacent to the depressed region, wherein an edge of the slot restricts movement of the module. A second form may include a raised lip, which is located adjacent to the module, and restricts movement of the module.

27 Claims, 3 Drawing Sheets

(56) References Cited

U.S. PATENT DOCUMENTS

| | | | | |
|---|---|---|---|---|
| 5,889,649 A | * | 3/1999 | Nabetani | G06K 7/0082 361/679.32 |
| 5,995,372 A | * | 11/1999 | Asakura | G06K 13/077 361/736 |
| 6,005,775 A | * | 12/1999 | Chiu | H05K 7/142 361/736 |
| 6,040,622 A | * | 3/2000 | Wallace | G11C 5/04 257/679 |
| 6,075,706 A | * | 6/2000 | Learmonth | G06K 19/077 235/441 |
| 6,088,221 A | * | 7/2000 | Bolognia | G06F 1/184 312/223.2 |
| 6,330,151 B1 | * | 12/2001 | Bates, III | 361/679.02 |
| 6,494,745 B1 | * | 12/2002 | Schremmer | 439/630 |
| 8,564,965 B2 | * | 10/2013 | Sloey et al. | 361/752 |
| 2007/0037431 A1 | * | 2/2007 | Feng et al. | 439/328 |

\* cited by examiner

COMPACT FLASH RETAINER

RELATED APPLICATIONS

This application claims priority from U.S. Provisional Patent Application 61/613,447, entitled "Compact Flash Retainer", which was filed on Mar. 20, 2012, and is incorporated by reference herein.

FIELD OF THE INVENTION

The present invention relates to a method and structure for retaining a memory card on a printed circuit board.

RELATED ART

Compact flash memory cards are typically retained on a printed circuit board using a clip and thumbscrew arrangement. However, the clip and thumbscrew undesirably consume space on the printed circuit board. Moreover, the thumbscrew engages with a fastener that is attached to the printed circuit board, wherein the fastener blocks signal routing within the printed circuit board. It would therefore be desirable to have an improved method and structure for retaining a memory card on a printed circuit board.

SUMMARY

Accordingly, the present invention provides a method and apparatus for retaining a removable module (such as a memory card) in engagement with an interface structure of a printed circuit board. The printed circuit board is coupled to a tray, such that the removable module is positioned between the printed circuit board and the tray. The tray includes one or more forms configured to receive the removable module, and prevent the module from moving out of engagement with the interface structure of the printed circuit board while the printed circuit board is coupled to the tray. In one embodiment, the tray includes a planar portion and a first form including a depressed region extending from the planar portion, wherein the first form is dimensioned to receive the removable module while the printed circuit board is coupled to the tray, and wherein the first form is dimensioned to prevent the module from moving enough to become disengaged with the printed circuit board while the printed circuit board is coupled to the tray.

A slot, which extends through the tray and adjoins the depressed region of the first form, may be included, wherein an edge of the slot restricts movement of the removable module while the printed circuit board is coupled to the tray.

In one embodiment, the tray further includes a second form adjoining the slot and including a raised lip extending from the planar portion in a different direction than the depressed region of the first form. The raised lip of the second form is positioned to prevent the module from moving enough to become disengaged with the interface structure of the printed circuit board while the printed circuit board is coupled to the tray.

In an alternate embodiment, the tray may include the raised lip of the second form, but not the depressed region of the first form.

In one embodiment, the tray, including the planar portion, the first form and the second form, is fabricated from a single sheet of metal.

The present invention will be more fully understood in view of the following description and drawings.

DETAILED DESCRIPTION

Figure 1:
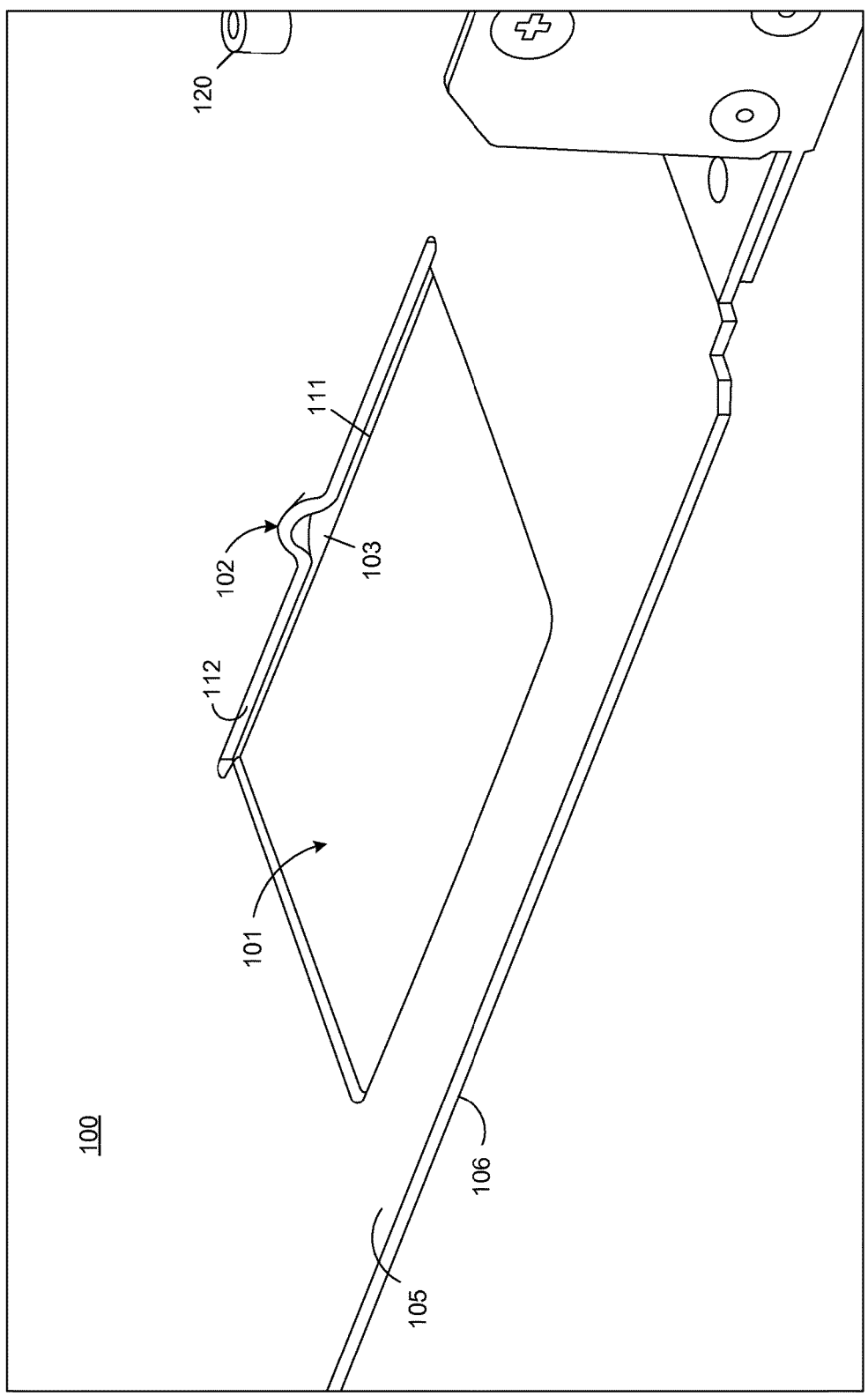
FIG. 1 is an isometric view of a tray that includes a first form and a second form for retaining a memory card in accordance with one embodiment of the present invention.
Figure 2:
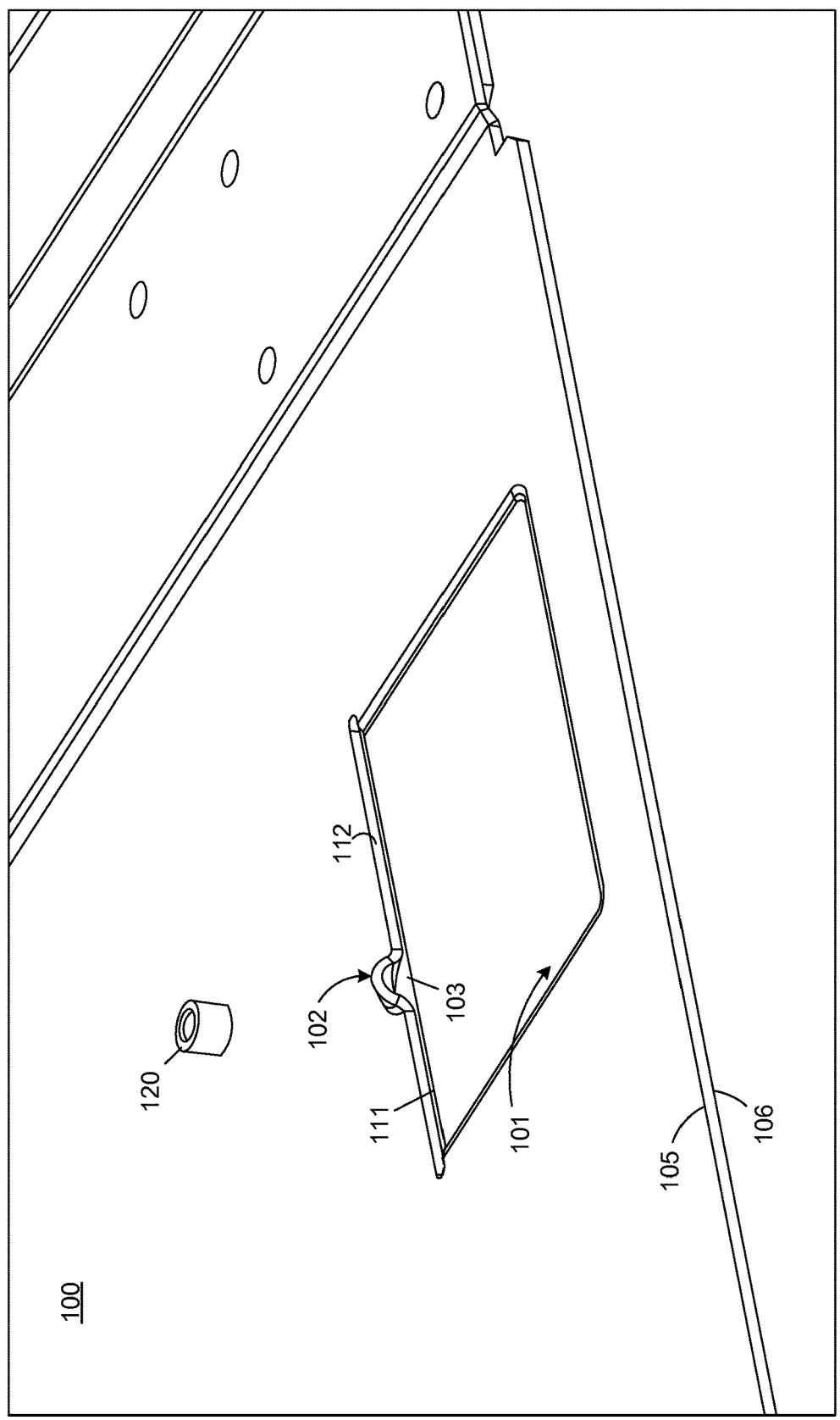
FIG. 2 is an isometric view of the tray of FIG. 1 from a different angle.

FIGS. 1 and 2 are isometric views of a sheet metal tray 100 in accordance with one embodiment of the present invention. As described in more detail below, sheet metal tray 100 may be used as a housing element for an electronic module (e.g., a network switch or 'blade') that includes a printed circuit board. The sheet metal tray 100 is processed to create a first form 101 and a second form 102, which are separated by a slot 103 that extends through the sheet metal tray 100. In general, the first form 101 is a depressed planar region having a shape that is dimensioned to receive (and retain) a memory card, such as a compact flash memory card. The second form 102 is a raised lip that is dimensioned to retain a memory card that is positioned in the first form 101, in a manner described in more detail below. Although the second form 102 is illustrated as a single raised lip that is centrally located along the length of the slot 103, it is understood that the second form 102 could have other configurations in other embodiments. For example, the second form 102 could include a plurality of raised lips along the length of the slot 103. Alternately, the second form 102 could include a single raised lip that extends the along the full length of the slot 103. Other variations of the second form 102 would be obvious to one of ordinary skill in the art.

The first form 101, the second form 102 and the slot 103 can be formed using conventional sheet metal processing techniques. In one embodiment, slot 103 is initially formed through the sheet metal tray 100 by a conventional punching or cutting process. The first form 101 is then formed by stamping a rectangular depression downward into the upper planar surface 105 of the tray 100, wherein the rectangular depression extends to (and is continuous with) a first edge 111 of the slot 103. Note that the slot 103 is slightly wider than the rectangular depression of the first form 101 in the illustrated embodiment. The second form 102 is formed by stamping a raised lip upward from the planar lower surface 106 of the tray 100, wherein the raised lip is continuous with a second edge 112 of the slot 103. At least a portion of the second edge 112 of the slot 103 is laterally exposed by the rectangular depression of the first form 101.

FIGS. 1 and 2 also illustrate a printed circuit board mounting structure 120, which is attached to the upper surface 105 of sheet metal tray 100. Although only one PCB mounting structure 120 is illustrated, it is understood that a plurality of such mounting structures are attached to the upper surface 105 of tray 100, in order to facilitate the mounting of a printed circuit board over the upper surface 105 of the tray 100.

Figure 3:
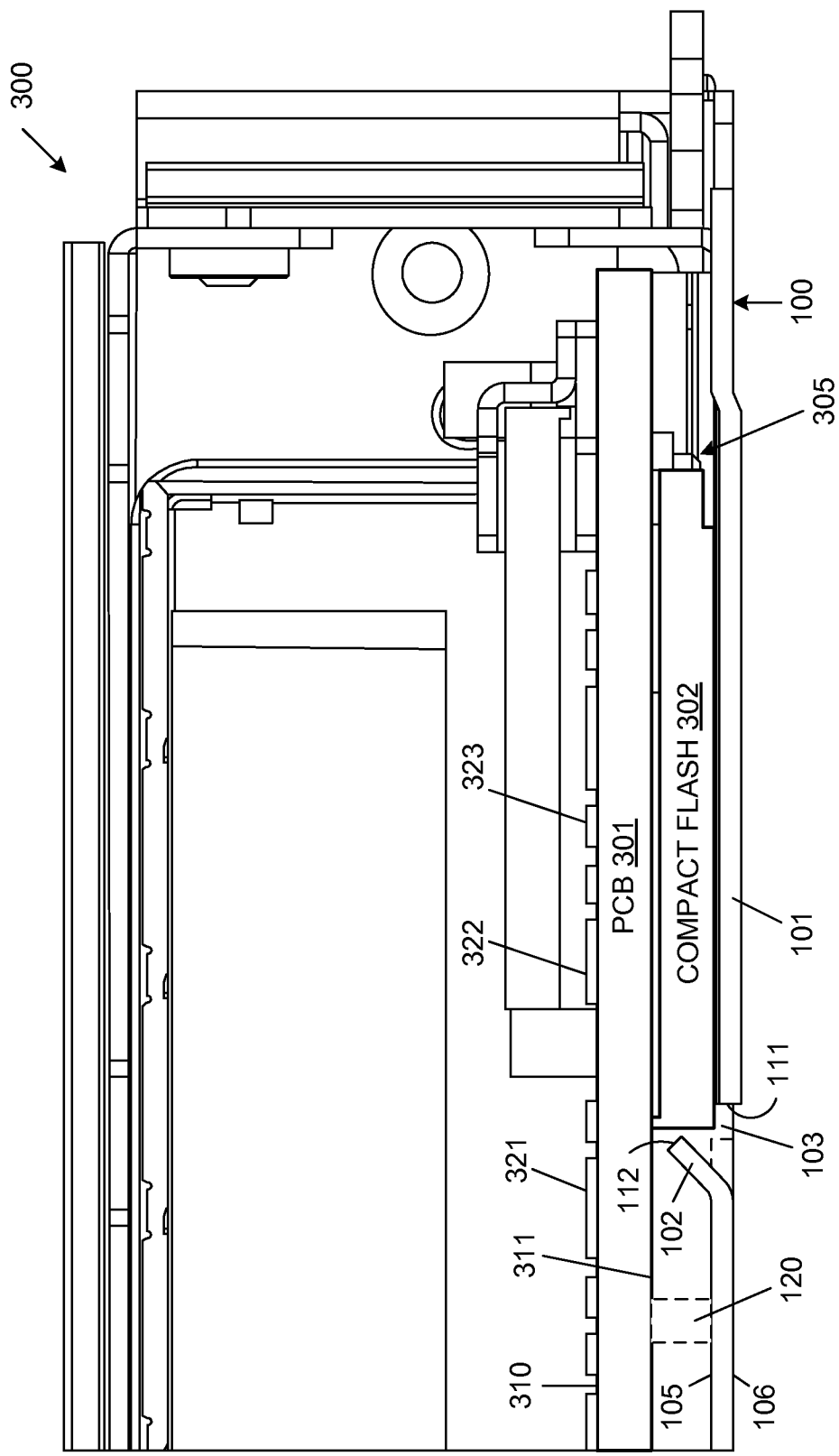
FIG. 3 is a cross sectional view of a system that includes a printed circuit board mounted on the tray of FIG. 1, wherein a memory card engaged with the printed circuit board is retained by the first and second forms of the tray, in accordance with one embodiment of the present invention.

FIG. 3 is a cross sectional/side view of a system 300 that includes a printed circuit board (PCB) 301 mounted on the sheet metal tray 100. The PCB 301 includes an upper surface 310 and a lower surface 311. Integrated circuit (IC) chips, including but not limited to IC chips 321-323, are mounted on the upper surface 310 of PCB 301 in a manner understood by those of ordinary skill in the art. The lower surface 311 of PCB 301 is sometimes referred to as the 'solder' side, because the IC chips located on the upper surface 310 are typically soldered to the PCB 301 from the lower surface 311. The lower surface 311 of PCB 301 is supported on PCB mounting structure 120 and other similar PCB mounting structures (not shown), thereby suspending PCB 301 over the upper surface 105 of sheet metal tray 100. PCB 301 may be attached to the PCB mounting structures by fasteners (e.g., screws), which extend through PCB 301. PCB mounting structure 120 provides a relatively small clearance between tray 100 and the solder side 311 of PCB 301.

A compact flash interface structure 305 is attached to the lower surface 311 of PCB 301, and is dimensioned to receive compact flash memory card 302. When compact flash memory card 302 is inserted into compact flash interface structure 305, the pins/pads of compact flash memory card 302 are placed into contact with electrically conductive traces within the compact flash interface structure 305. These electrically conductive traces, in turn, are connected to electrically conductive traces of the PCB 301.

In one embodiment, compact flash memory card 302 is inserted into compact flash interface structure 305 before PCB 301 is attached to sheet metal tray 100. After PCB 301 is attached to tray 100, the lower portion of compact flash memory card 302 is located within the rectangular depression of the first form 101 of tray 100, as illustrated. In this manner, the rectangular depression of the first form 101 provides additional space for locating the compact flash memory card 302 under PCB 301 (without requiring modification to the mounting structures 120 used to connect the PCB 301 to tray 100). That is, the first form 101 allows enough clearance for the compact flash card 302 to fit under the solder side 311 of PCB 301. In addition, the edges of the first form 101 may help to restrict the movement of the compact flash memory card 302.

Moreover, after PCB 301 is attached to tray 100, the raised lip of the second form 102 of tray 100 is positioned immediately adjacent to the rear edge of compact flash memory card 302 (i.e., the edge of card 302 located opposite the compact flash interface structure 305). The raised lip of the second form 102 is located such that the rear edge of compact flash memory card 302 will come into physical contact with the raised lip of the second form 102 (and the second edge 112 of the slot 103) before the pins/pads of the memory card 302 move out of electrical contact with the conductive traces in the compact flash interface structure 305. That is, the second form 102 (and the second edge 112 of the slot 103) will hold the compact flash memory card 302 in proper physical contact with interface structure 305, preventing the memory card 302 from sliding out of interface structure 305, even in the presence of movement or vibrations within system 300.

Advantageously, the first form 101 and the second form 102 are inexpensive and easy to form within sheet metal tray 100. Moreover, by retaining the memory card 302 with the first form 101 and the second form 102, there is no need to use real estate of the PCB 301 for the purpose of securing the memory card 302 within the interface structure 305.

Although the present invention has been described in connection with several embodiments, it is understood that other embodiments are possible, and would fall within the scope of the present invention. For example, in one alternate embodiment, the first form 101 may be eliminated. It is understood that the PCB 301 may have to be mounted slightly (higher) further from the upper surface 105 of the tray 100 in this embodiment. In yet other embodiments, compact flash memory card 302 may be replaced with other types of memory cards, or with other types of cards/modules. Thus, the present invention is limited only by the following claims.

I claim:

1. A tray for housing a printed circuit board having a removable module engaged therewith, the tray comprising:
   a planar portion; and
   a first form including a depressed region extending from the planar portion, wherein the first form is dimensioned and located to receive the module as the printed circuit board, with the module already engaged therewith, is coupled to the tray, and wherein the first form is dimensioned to prevent the module from moving enough to become disengaged with the printed circuit board while the printed circuit board is coupled to the tray.

2. The tray of claim 1, further comprising a mounting structure coupled to the planar portion and configured to support the printed circuit board.

3. The tray of claim 1, further comprising a slot extending through the planar section and adjoining the first form.

4. The tray of claim 3, further comprising a second form adjoining the slot and including a raised lip extending from the planar portion in a different direction than the depressed region of the first form.

5. The tray of claim 4, wherein the raised lip of the second form is positioned to prevent the module from moving enough to become disengaged with the printed circuit board while the printed circuit board is coupled to the tray.

6. The tray of claim 1, wherein the planar portion and the first form comprise sheet metal.

7. A tray for housing a printed circuit board having a removable module engaged therewith, the tray comprising:
   a planar portion; and
   a form including a raised lip extending from the planar portion, wherein the raised lip of the form is positioned to be located adjacent to the module as the printed circuit board, with the module already engaged therewith, is coupled to the tray, and wherein the raised lip of the form is dimensioned to prevent the module from moving enough to become disengaged with the printed circuit board while the printed circuit board is coupled to the tray.

8. The tray of claim 7, further comprising a mounting structure coupled to the planar portion and configured to support the printed circuit board.

9. The tray of claim 8, further comprising a slot extending through the planar section and adjoining the form.

10. The tray of claim 9, wherein the planar portion and the form comprise sheet metal.

11. A system comprising:
    a printed circuit board including an interface structure;
    a module removably engaged with the interface structure; and
    a tray including a planar portion and a first form including a depressed region that extends from the planar portion, wherein the printed circuit board, with the module already engaged therewith, is coupled to the tray such that the module is located within the depressed region of the first form, and wherein the depressed region of the first form is dimensioned to prevent the module from moving enough to become disengaged from the interface structure while the printed circuit board is coupled to the tray.

12. The system of claim 11, further comprising a mounting structure that supports the printed circuit board over the tray.

13. The system of claim 11, further comprising a slot extending through the planar section and adjoining the first form.

14. The system of claim 13, further comprising a second form adjoining the slot and including a raised lip extending from the planar portion in a different direction than the depressed region of the first form.

15. The system of claim 14, wherein the raised lip of the second form is positioned to prevent the module from moving enough to become disengaged with the printed circuit board while the printed circuit board is coupled to the tray.

16. The system of claim 11, wherein the planar portion and the first form comprise sheet metal.

17. A system comprising:
a printed circuit board including an interface structure;
a module removably engaged with the interface structure; and
a tray including a planar portion and a form including a raised lip that extends from the planar portion, wherein the printed circuit board, with the module already engaged therewith, is coupled to the tray such that the module is located adjacent to the raised lip of the form, and wherein the raised lip of the form is dimensioned to prevent the module from moving enough to become disengaged from the interface structure while the printed circuit board is coupled to the tray.

18. The system of claim 17, further comprising a mounting structure that supports the printed circuit board over the tray.

19. The system of claim 17, further comprising a slot extending through the planar section and adjoining the form.

20. The system of claim 17, wherein the planar portion and the form comprise sheet metal.

21. A method of retaining a module in engagement with an interface structure of a printed circuit board comprising:
positioning the printed circuit board over a tray having a first form that includes a depressed region of the tray, wherein the module is aligned with the first form; and
coupling the printed circuit board, with the module already engaged therewith, to the tray, wherein the module is located within the depressed region of the first form, whereby the depressed region prevents the module from moving out of engagement with the interface structure while the printed circuit board is coupled to the tray.

22. The method of claim 21, wherein the step of coupling the printed circuit board to the tray comprises supporting the printed circuit board over the tray with a mounting structure that is coupled to the tray.

23. The method of claim 21, further comprising retaining the module in engagement with the interface structure with an edge of a slot formed through the tray at a location adjoining the depressed region of the first form.

24. The method of claim 23, further comprising retaining the module in engagement with the interface structure with a second form of the tray including a raised lip adjoining the slot.

25. A method of retaining a module in engagement with an interface structure of a printed circuit board comprising:
positioning the printed circuit board over a tray having a form that includes a raised lip, wherein the module is aligned with the raised lip of the form; and
coupling the printed circuit board, with the module already engaged therewith, to the tray, wherein the module is located adjacent to the raised lip, whereby the raised lip prevents the module from moving out of engagement with the interface structure while the printed circuit board is coupled to the tray.

26. The method of claim 25, wherein the step of coupling the printed circuit board to the tray comprises supporting the printed circuit board over the tray with a mounting structure that is coupled to the tray.

27. The method of claim 25, further comprising retaining the module in engagement with the interface structure with an edge of a slot formed through the tray at a location adjoining the raised lip of the form.

* * * * *